United States Patent
Ryoichi

[11] Patent Number: 5,850,677
[45] Date of Patent: Dec. 22, 1998

[54] METHOD OF MOUNTING A PIEZOELECTRIC ELEMENT

[75] Inventor: Morimoto Ryoichi, Kyoto, Japan

[73] Assignee: Murata Mfg. Co., Ltd., Kyoto, Japan

[21] Appl. No.: 749,054

[22] Filed: Nov. 14, 1996

Related U.S. Application Data

[62] Division of Ser. No. 496,918, Jun. 30, 1995, Pat. No. 5,604,667, which is a continuation of Ser. No. 255,362, Jun. 8, 1994, abandoned, which is a continuation of Ser. No. 134,415, Oct. 8, 1993, Pat. No. 5,359,494.

[30] Foreign Application Priority Data

Oct. 13, 1992 [JP] Japan .................. U.M. 4-7726
Jan. 8, 1993 [JP] Japan .................. U.M. 5-2825

[51] Int. Cl.$^6$ .................................................. H01L 41/22
[52] U.S. Cl. .................... 29/25.35; 310/324; 310/344
[58] Field of Search ...................... 29/25.35; 310/344, 310/324; 228/180.21, 180.22, 180.1, 179.1

[56] References Cited

U.S. PATENT DOCUMENTS

| | | | |
|---|---|---|---|
| 3,303,393 | 2/1967 | Hymes et al. ................ | 317/101 |
| 4,151,543 | 4/1979 | Hayakawa et al. ............ | 357/65 |
| 4,604,644 | 8/1986 | Beckham et al. ............. | 357/80 |
| 4,703,218 | 10/1987 | Takahashi et al. ............ | 310/348 |
| 4,749,120 | 6/1988 | Hatada ....................... | 288/123 |
| 4,967,166 | 10/1990 | Marcellus .................... | 331/116 R |
| 5,012,969 | 5/1991 | Hatada et al. ............... | 288/104 |
| 5,185,550 | 2/1993 | Morita et al. ................ | 310/344 |
| 5,235,135 | 8/1993 | Knecht et al. ............... | 174/52.3 |
| 5,291,460 | 3/1994 | Harada et al. ............... | 367/140 |

FOREIGN PATENT DOCUMENTS

| | | | |
|---|---|---|---|
| 29 09 370 A1 | 9/1979 | Germany .................. | H01L 23/32 |
| 4-77010 | 3/1992 | Japan ....................... | H03H 3/02 |

*Primary Examiner*—Carl E. Hall
*Attorney, Agent, or Firm*—Howell & Haferkamp, L.C.

[57] ABSTRACT

An opening is formed in a region of a circuit board opposite a vibration region E of a piezoelectric element. The piezoelectric element is mounted to the circuit board, and electrical connections extend between and support the piezoelectric element from the circuit board by a solder. The soldered connection portions are surrounded by a bonding agent. An opening in the circuit board prevents any excess bonding agent from invading the vibration region E of the piezoelectric element, and the bonding agent assists in dispersing stresses exerted on the circuit board thereby minimizing the stresses transferred to the piezoelectric element.

16 Claims, 3 Drawing Sheets

FIG. 4
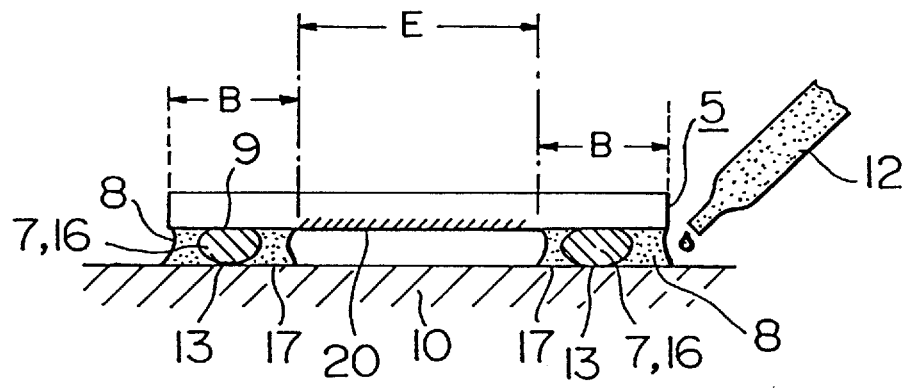
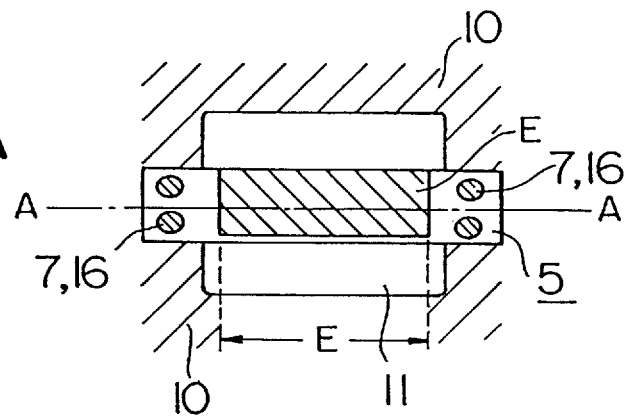
FIG. 5A
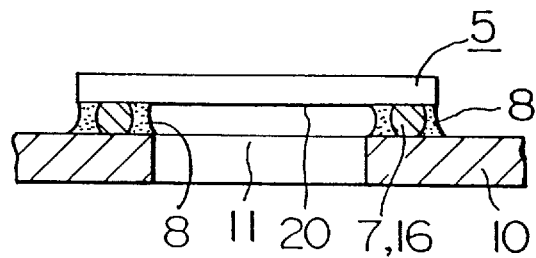
FIG. 5B

METHOD OF MOUNTING A PIEZOELECTRIC ELEMENT

CROSS-REFERENCE TO RELATED APPLICATIONS

This application is a division of patent application Ser. No. 08/496,918, filed Jun. 30, 1995, now U.S. Pat. No. 5,604,667, issued Feb. 18, 1997, entitled "Mounting structure for mounting a piezoelectric element," which itself is a continuation of patent application Ser. No. 08/225,362, filed Jun. 8, 1994, now abandoned, which was itself a continuation of patent application Ser. No. 08/134,415, filed Oct. 8, 1993, now U.S. Pat. No. 5,359,494, issued Oct. 25, 1994, entitled "Mounting Structure Of Piezoelectric Element".

BACKGROUND OF THE INVENTION

1. Field of the Invention

The present invention relates to a mounting structure for, and a method of, mounting a piezoelectric element to a circuit board.

2. Description of the Prior Art

Extended use is made of some electronic parts such as piezoelectric filters which utilize piezoelectric effect. Such piezoelectric filters include surface elastic wave filters which utilize propagation of surface elastic waves.

Referring to FIG. 1, there is illustrated a chip type surface wave filter as an example of a piezoelectric element. The piezoelectric element 5 includes connecting electrodes 9 formed in the vicinity of opposite ends of the piezoelectric element and a vibration region E located between the connecting electrodes 9. The piezoelectric element 5 uses a glass plate 15 as an element substrate on which comb electrodes are provided. A zinc oxide (ZnO) film 18 is formed so as to cover the comb electrodes for formation of the vibration region E of the piezoelectric element 5.

The piezoelectric element 5 has its length L greater than its width W, and has a ratio L/W ranging from 3 to 5 to exhibit its elongated structure.

In the prior art, to mount the piezoelectric element 5 on a circuit board 10 the piezoelectric element 5 is directly connected with and fixed to the circuit board 10 through a solder 7. This produces a problem in that application of mechanical or thermal stress to the circuit board 10 causes the stresses to be directly exerted to the piezoelectric element 5 through connection portions. The piezoelectric element 5, which has the elongated structure, is therefore likely to be bent in the direction of the length thereof (i.e., an arrow B in FIG. 1) as the stress is exerted thereon. The piezoelectric element 5, being formed with the glass plate 15, is hard and fragile and hence is likely to be cracked in the vicinity of the solder connection portions if the piezoelectric element is made to bend as described above. There is also a problem of the solder 7 being exfoliated to result in the electric characteristics of the piezoelectric element 5 being deteriorated.

Further, another problem occurs upon mounting the piezoelectric element 5 on a resin substrate and the like. The thermal expansion coefficients of the glass and the resin are different from each other (thermal expansion coefficient of the glass is approximately $3-5 \times 10^{-6}$ while that of the epoxy resin being approximately $15 \times 10^{-6}$) and hence any stress due to the difference between the thermal expansion coefficients may cause the piezoelectric element 5 to crack.

SUMMARY OF THE INVENTION

To solve these problems in the prior art, it is an object of the present invention to provide a mounting structure of a piezoelectric element, the piezoelectric element being mounted to a circuit board, wherein mechanical or thermal stress exerted on the circuit board is not substantially transferred to the piezoelectric element and hence no crack is produced, and wherein electric characteristics of the piezoelectric element are not deteriorated.

To achieve the above objective, a mounting structure for a piezoelectric element having longitudinal ends according to the present invention comprises connecting electrodes disposed in the vicinity of opposite longitudinal ends of the piezoelectric element, a vibration region located between the connecting electrodes, and a circuit board to which the piezoelectric element is directly fixed by a solder connection between the connecting electrodes and the circuit board. Further, a bonding agent is applied to surrounding regions of the soldered connection portions between the connecting electrodes and the circuit board for fixing the piezoelectric element and the circuit board in a united manner, the surrounding regions being kept away from the vibration region of the piezoelectric element.

In accordance with the present invention, the surrounding regions of the soldered connection portions between the piezoelectric element and the circuit board are filled with a bonding agent for fixing the circuit board and the piezoelectric element in a united manner. The surrounding regions are segregated from the vibration region of the piezoelectric element, so that any mechanical or thermal stress to the circuit board, although being applied to the piezoelectric element through the soldered connection portions, is largely dispersed by the bonding agent. Hence the stress applied to the piezoelectric element is reduced thereby minimizing cracking and minimizing deterioration of the electrical characteristics in the piezoelectric element due to stress.

The mounting structure for a piezoelectric element according to the present invention is further characterized in that it includes means disposed in the circuit board for preventing the bonding agent applied to the surrounding regions of the soldered connection portions from invading the vibration region of the piezoelectric element.

Further, in according with the present invention, any excess bonding agent applied to the soldered connection portions is disposed through the bonding agent invasion prevention means in the circuit board and hence the bonding agent is prevented from invading and adhering to the vibration region of the piezoelectric element.

BRIEF DESCRIPTION OF THE DRAWINGS

The above and other objects, features and advantages of the present invention will be better understood from reading the following Description Of The Preferred Embodiments taken in conjunction with the accompanying drawings in which:

FIG. 4 is a side elevation view illustrating a mounting structure of a piezoelectric element according to a first embodiment of the present invention;

FIG. 5A is a top plan view of an alternative embodiment of the present invention illustrating a mounting structure of a piezoelectric element having an opening in the circuit board providing bonding agent prevention means;

FIG. 5B is a side cross-sectional view taken along line AA of FIG. 5A illustrating the mounting structure of FIG. 5A;

DETAILED DESCRIPTION OF THE PREFERRED EMBODIMENTS

In what follows, there will be described some embodiments of a mounting structure of a piezoelectric element according to the present invention with reference to the accompanying drawings. Like symbols in the description of the present embodiments are used to indicate like parts, and hence the overlapping detailed description thereof will be omitted.

Figure 1:
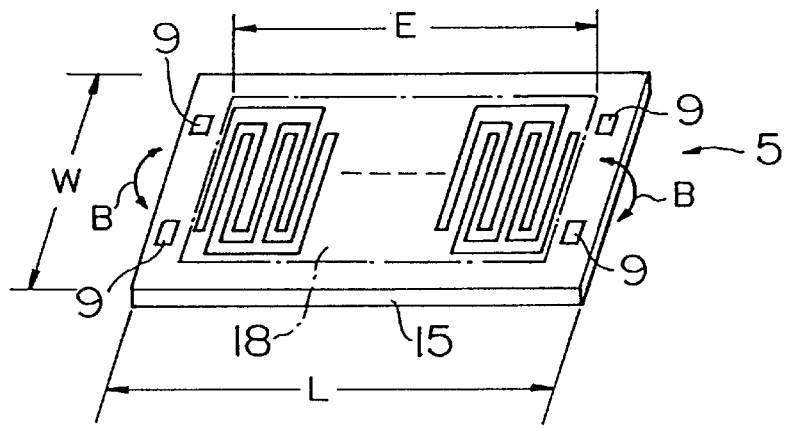
FIG. 1 is an isometric view illustrating a piezoelectric element of the present invention.
Figure 2:
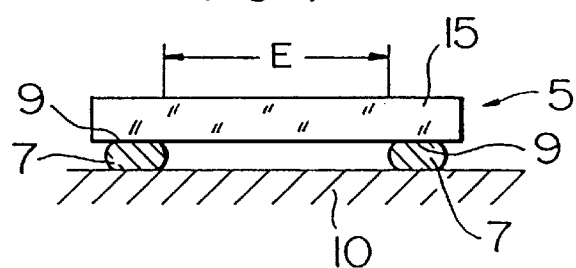
FIG. 2 is a side elevation view illustrating a prior art mounting structure of a piezoelectric element.
Figure 3:
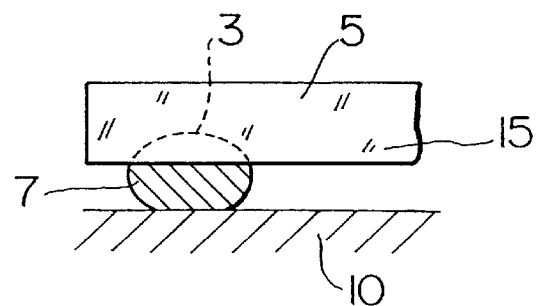
FIG. 3 is a side elevation view illustrating inconvenience of the prior art mounting structure of a piezoelectric element.

FIG. 1 illustrates a mounting structure of a piezoelectric element 5 having longitudinal ends according to the first embodiment of the present invention. Connecting electrodes 9 are formed on opposite longitudinal ends of the piezoelectric element 5, and a vibration region E exists between the connecting electrodes. The piezoelectric element 5 is connected with and fixed to a circuit board 10 by connecting the connecting electrodes 9 with the circuit board 10 through a solder (see FIG. 4). Surrounding regions 17 are formed around the solder connections, the surrounding regions being segregated from the vibration region.

In the operation of mounting the piezoelectric element 5 constructed as above on the circuit board 10, a solder cream, for example, is applied to the circuit board at solder connection portion regions 13. The piezoelectric element 5 is positioned in relation to the circuit board 10 such that solder connections between the connecting electrodes 9 and the circuit board are made utilizing the solder cream. The solder connection is preferably made through reflowing. Hereby, the piezoelectric element 5 is mounted on the circuit board.

In an alternative embodiment, solder bumps 16 are formed to the connecting electrodes 9 by supplying a solder 7 on the connecting electrodes 9 of the piezoelectric element 5 prior to positioning the piezoelectric element. The piezoelectric element 5 is positioned relative to the circuit board 10 and the piezoelectric element is mounted to the circuit board. In this embodiment the piezoelectric element 5 and circuit board 10 are both heated to melt the solder bumps 16 thereby creating solder connections to facilitate mounting of the piezoelectric element on the circuit board. Surrounding regions 17 are formed around the solder connections, the surrounding regions being segregated from the vibration region E.

In succession, surrounding regions 17 are filled, with the aid of a dispenser 12 for example, with a bonding agent 8 (comprising thermosetting resin, etc.) to distribute any stress exerted on the soldered connection portions. The bonding agent 8 does not invade the vibration region E.

In the present embodiment, the surrounding regions 17 of the solder connection portions between the piezoelectric element 5 and the circuit board 10 are filled with the bonding agent 8 serving to disperse any stress exerted on the soldered connection portions. Accordingly, any mechanical or thermal stress exerted on the circuit board 10 is substantially dispersed and reduced by the bonding agent 8. This results in the piezoelectric element being less likely to crack, improves its resistance to bending, and minimizes exfoliation of the solder, all without deteriorizing the electrical characteristics of the piezoelectric element which might otherwise be caused by the stress.

Although the piezoelectric element is likely to be cracked in the prior art when the circuit board 10 is made of resin (because of the difference in thermal expansion coefficients therebetween), in the present embodiment any stress from the circuit board 10 is substantially dispersed through the bonding agent 8 and hence any stress which might otherwise be exerted on the piezoelectric element 5 is reduced. Accordingly, fear of the piezoelectric element 5 being cracked is reduced and the resistance against thermal shock is improved. These improvements are attained even when using an epoxy resin board.

Referring to FIGS. 5A and 5B, there is illustrated a mounting structure of a piezoelectric element according to a second embodiment of the present invention. The embodiment is provided as a result of a further improvement of the first embodiment in which an opening 11, as bonding agent prevention means, is formed in a region of the circuit board 10 opposite the vibration region E of the piezoelectric element 5. The opening 11 penetrates the circuit board 10 preventing excess bonding agent 8 from invading and adhering to the vibration region E when the surrounding regions of the soldered connection portions are filled with the bonding agent 8.

In this embodiment, the opening 11 is formed in the region of the circuit board 10 opposite to the vibration region E of the piezoelectric element 5. Accordingly, any excess bonding agent 8 is discharged away from the vibration region when the bonding agent 8 is applied and hardened around the soldered connection portions to prevent the bonding agent 8 from invading and adhering to the vibration region E of the piezoelectric element 5.

There is a risk that the characteristics of the piezoelectric element will deteriorate if resin such as the bonding agent 8 adheres to the vibration region E of the piezoelectric element 5. However, the present embodiment ensures that the bonding agent 8 does not adhere to the vibration region E thereby minimizing the risk of deteriorated piezoelectric element characteristics. Additionally, any mechanical or thermal stress exerted on the circuit board 10 is dispersed by the bonding agent 8 to ensure the identical advantage to that of the first embodiment.

Figure 6A:
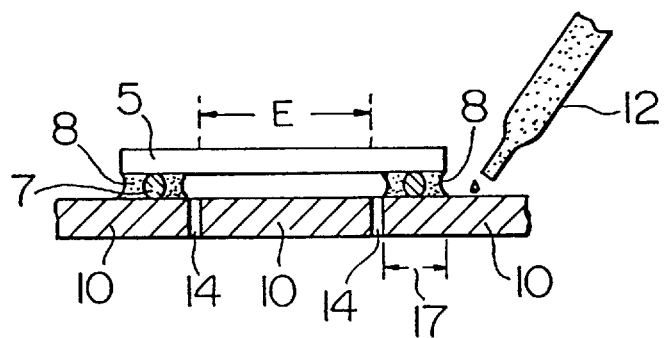
FIG. 6A is a side cross-sectional view across a longitudinal axis of the piezoelectric element in FIG. 6B illustrating a mounting structure of FIG. 6B.
Figure 6B:
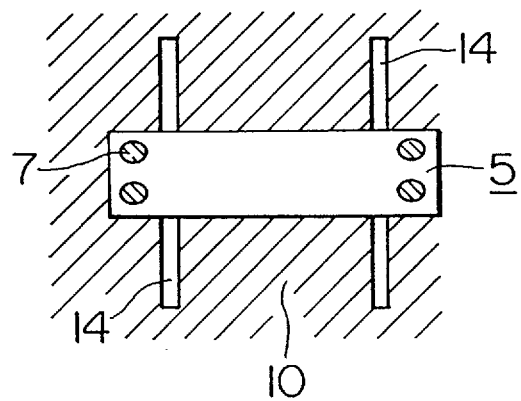
FIG. 6B is a top plan view illustrating another embodiment of the present invention having two slots in the circuit board providing bonding agent prevention means.

Referring to FIGS. 6A, a side view, and 6B, a top plan view, there is illustrated a third embodiment of the present invention. Although in the second embodiment, the opening 11 is formed in the circuit board 10 as a measure to prevent the bonding agent 8 from invading and adhering to a lower portion 20 of the vibration region E of the piezoelectric element 5, a slot 14 may be provided as disclosed in the present embodiment in the circuit board 10 at a boundary between the vibration region E and the surrounding region 17 of the soldered connection portion. Hereby, the bonding agent 8 is prevented from invading the vibration region E of the piezoelectric element 5.

It should be noted that although in the aforementioned embodiments use is made of the thermal resin as the bonding agent, use may be made of thermoplastic resin for example, and further use may be made of arbitrary insulating materials if stress dispersion is allowed therewith.

Further, although in the aforementioned embodiments a piezoelectric element was demonstrated by way of example, the present invention may be applied to other elements such as diodes and optical detector elements which are mountable on a circuit board with the same mounting technique.

In accordance with the present invention, the surrounding regions of the soldered connection portions between the piezoelectric element and the circuit board are filled with a bonding agent, so that mechanical or thermal stress is dispersed by the bonding agent even though they are exerted on the circuit board, and hence the stress applied to the piezoelectric element is reduced. Thus, a fear of the piezoelectric element being cracked is reduced, and electric characteristics of the piezoelectric element are not deteriorated owing to the stress.

Additionally, there is provided bonding agent invasion prevention means on a region of the circuit board opposite to the vibration region of the piezoelectric element, so that any excess bonding agent is removed by the bonding agent invasion prevention means upon the bonding agent being applied to and hardened around the soldered connection portions. The excess bonding agent is thereby prevented from invading and adhering to the vibration region of the piezoelectric element. Thus, a fear of the characteristics of the piezoelectric element being deteriorated is reduced.

Although illustrated embodiments of the present invention are described herein with reference to the accompanying drawings, it is to be understood that the invention is not limited to those precise embodiments and that various other changes and modifications may be effected therein by one skilled in the art without departing from the scope or spirit of the invention. The scope of the invention is defined solely by the claims, and their equivalents.

What is claimed is:

1. A method of mounting a piezoelectric element to a circuit board, the piezoelectric element having a vibration region, the method comprising the steps of:
    positioning the piezoelectric element relative to the circuit board;
    soldering the piezoelectric element to the circuit board to form a soldered electrical connection;
    applying a bonding agent around at least a portion of the soldered electrical connection; and
    drawing excess bonding agent away from the vibration region of the piezoelectric element through at least one hole in the circuit board.

2. The method of claim 1 wherein the piezoelectric element has a plurality of connecting electrodes located at opposite ends of the piezoelectric element electrically connecting the piezoelectric element to the circuit board at a plurality of locations, the vibration region being formed therebetween, and wherein the step of applying the bonding agent further includes applying the bonding agent at least partially around at least one of the soldered electrical connections.

3. The method of claim 2 wherein the step of applying the bonding agent further includes applying the bonding agent around and substantially surrounding the at least one soldered connection.

4. The method of claim 3 wherein the at least one hole in the circuit board comprises an opening formed in the circuit board in a region opposed to the vibration region of the piezoelectric element and the drawing step comprises drawing excess bonding agent into said opening and away from the vibration region.

5. The method of claim 4 wherein the vibration region has a circumference and the at least one hole in the circuit board comprises at least one slot formed in the circuit board in a region substantially adjacent to at least one of the connecting electrodes and opposed to the circumference of the vibration region and the drawing step comprises drawing excess bonding agent into the at least one slot and away from the vibration region.

6. A method of mounting a piezoelectric element to a circuit board, the piezoelectric element having a vibration region between connecting electrodes at opposite longitudinal ends of the piezoelectric element and the circuit board having solder connection portion regions for electrically connecting the piezoelectric element to the circuit board;
    the method comprising the steps of:
        forming an opening in the circuit board opposite the vibration region of the piezoelectric elements;
        positioning the piezoelectric element relative to the circuit board;
        soldering the piezoelectric element to the circuit board to form a soldered electrical connection; and
        applying a bonding agent around at least a portion of the soldered electrical connection segregated from the vibration region of the piezoelectric element to disperse stress communicated by the circuit board to the piezoelectric element through the soldered electrical connection, the opening in the circuit board preventing the bonding agent from invading and adhering to the vibration region.

7. A method of mounting a piezoelectric element to a circuit board, the piezoelectric element having a vibration region between connecting electrodes at opposite longitudinal ends of the piezoelectric element and the circuit board having solder connection portion regions for electrically connecting the piezoelectric element to the circuit board;
    the method comprising the steps of:
        positioning the piezoelectric element relative to the circuit board;
        soldering the piezoelectric element to the circuit board to form a soldered electrical connection; and
        applying a bonding agent around at least a portion of the soldered electrical connection segregated from the vibration region of the piezoelectric element to disperse stress communicated by the circuit board to the piezoelectric element through the soldered electrical connection; and
        discharging bonding agent away from the vibration region through a hole in the circuit board opposite the vibration region of the piezoelectric element.

8. A method of mounting a piezoelectric element to a circuit board, the piezoelectric element having a vibration region between connecting electrodes at opposite longitudinal ends of the piezoelectric element and the circuit board having solder connection portion regions for electrically connecting the piezoelectric element to the circuit board;
    the method comprising the steps of:
        positioning the piezoelectric element relative to the circuit board;
        soldering the piezoelectric element to the circuit board to form a soldered electrical connection; and
        applying a bonding agent around at least a portion of the soldered electrical connection segregated from the vibration region of the piezoelectric element to disperse stress communicated by the circuit board to the piezoelectric element through the soldered electrical connection; and
        forming slots in the circuit board at a boundary between the vibration region of the piezoelectric element and the solder connection portions of the circuit board to prevent the bonding agent from invading the vibration region of the piezoelectric element.

9. The method of claim 6 further comprising the step of applying a solder cream to the circuit board at the solder connection portion region;
    and further wherein the positioning step comprises positioning the piezoelectric element in relation to the circuit board so that the soldered electrical connections between the connecting electrodes and the circuit board are made by the solder cream.

10. The method of claim 9 wherein the soldered electrical connection is made through reflowing.

11. The method of claim 6 and further comprising:

forming solder bumps on the connecting electrodes of the piezoelectric element prior to positioning the piezoelectric element;

and wherein the soldering step comprises heating the piezoelectric element and the circuit board to melt the solder bumps to create soldered electrical connections between the piezoelectric element and the circuit board.

12. A method of mounting a piezoelectric element having a vibration region to a circuit board and of dispersing stress from the circuit board, the circuit board having means for preventing invasion of a bonding agent into the vibration region of the piezoelectric element, the method comprising the steps of:

positioning the piezoelectric element relative to the circuit board;

soldering the piezoelectric element to the circuit board to form a soldered electrical connection and to thereby mount the piezoelectric element to the circuit board;

applying bonding agent to the mounted piezoelectric element around at least a portion of the soldered electrical connection; and drawing excess bonding agent away from the vibration region of the piezoelectric element through the invasion preventing means on the circuit board.

13. The method of claim 12 wherein the piezoelectric element has a plurality of connecting electrodes located at opposite ends of the piezoelectric element electrically connecting the piezoelectric element to the circuit board at a plurality of locations, the vibration region being formed therebetween, and wherein the step of applying bonding agent further includes applying bonding agent at least partially around at least one of the soldered electrical connections.

14. The method of claim 13 wherein step of applying bonding agent further includes applying bonding agent around and substantially surrounding the at least one soldered connection.

15. The method of claim 14 wherein the invasion preventing means comprises an opening formed in the circuit board in a region opposed to the vibration region of the piezoelectric element, and the drawing step comprises drawing excess bonding agent into said opening and away from the vibration region.

16. The method of claim 15 wherein the vibration region has a circumference and the invasion prevention means comprises at least one slot formed in the circuit board in a region substantially adjacent to at least one of the connecting electrodes and opposed to the circumference of the vibration region, and the drawing step comprises drawing excess bonding agent into the at least one slot and away from the vibration region.

* * * * *